United States Patent [19]

Hayashi et al.

[11] Patent Number: 5,260,134
[45] Date of Patent: Nov. 9, 1993

[54] ORGANIC COMPOSITE

[75] Inventors: Shigenori Hayashi, Kanagawa; Masahiko Sato, Hokkaido, both of Japan

[73] Assignee: Semiconductor Energy Laboratory Co., Ltd., Kanagawa, Japan

[21] Appl. No.: 831,848

[22] Filed: Feb. 6, 1992

[30] Foreign Application Priority Data

Feb. 14, 1991 [JP] Japan .................................. 3-42806

[51] Int. Cl.$^5$ ..................... B32B 27/36; B05D 5/12
[52] U.S. Cl. .................................. 428/412; 428/421; 428/451; 428/473.5; 428/480; 428/516; 428/518; 428/519; 427/109
[58] Field of Search ............... 428/421, 451, 480, 412, 428/473.5, 516, 518, 519

[56] References Cited

U.S. PATENT DOCUMENTS 4,554,339 11/1985 Hockemeyer ...................... 428/451
4,904,525 2/1990 Taniguchi et al. ................. 428/451

*Primary Examiner*—P. C. Sluby
*Attorney, Agent, or Firm*—Sixbey, Friedman, Leedom & Ferguson

[57] ABSTRACT

The present invention is related to an organic composite. This organic composite comprises a substrate having an organic material surface and a film formed on the substrate by such plasma CVD method. Said organic material have an unsaturated bond of carbon. This organic composite gives an improved performance in an adhesion between the film and the substrate.

6 Claims, No Drawings

ORGANIC COMPOSITE

BACKGROUND OF THE INVENTION

1. Field of the Invention

The present invention is related to an organic composite. More particularly, the present invention is related to an organic composite, which has improved adhesion characteristics between a member having an organic surface such as a plastic coating or a painted iron plate, and an inorganic protective film formed on the member, by a plasma CVD (Chemical Vapor Deposition) method.

In accordance with the present invention, the inorganic protective film is transparent mostly in a visible ray region, and a transparent plastic member protected with the inorganic film is usable for vehicles such as an automobile or an electric car, or for a window of building or house. The member may also be used on a painted automotive body and the like, as an abrasion resistant film.

2. Description of the Prior Art

For the purpose of lightening a window of a vehicle, such as an automobile or an electric car, and making it easy to design the window shape, it has been investigated to use such plastics as an acrylic and a polycarbonate resin. These, however, pose a problem in that the light-transmittance of the window deteriorates due to severe environmental exposure such as sun light or wind and rain, or due to fine flaw formation on the window caused by sand dust.

In case of the front window of an automobile, an abrasion flaw caused by a wiper motion can pose problems. Also in case of the automotive body, flaw formation on a painted surface may result under severe weather conditions.

The present inventors conducted an experiment to improve mechanical strength and resistance to abrasion on a plastics coated surface and a painted automotive body by laminating a transparent carbon film on them. Two Japanese Patent applications are filed having the Filing Nos. Showa 63 (1988)-233166 and Showa 63 (1988)-230788, and their titles are respectively "A Material Covered With a Carbon Film and Making Method Therefor" and "A Chassis Covered With a Carbon Film and a Member Thereof".

However, it has been found that the above mentioned lamination of the transparent carbon film on a plastics coated surface and a painted body lacks adhesive strength when subjected to an environmental test under high temperature and humidity for a long time. This is considered to be caused by peeling which arises out of increasing film stress from expansion of water contained in the organic materials present in plastics and painted film, or arising out of water immersed into fine openings and gaps which are formed by imperfect adhesion between the carbon film and the organic material substrate.

SUMMARY OF THE INVENTION

Accordingly, it is an object of the present invention to improve the above mentioned adhesiveness of a protective film formed on a window of a vehicle, such as an automobile or an electric car, or on an automotive body which are subjected to an exposure to wind and rain.

The present invention provides an organic composite which comprises a substrate having an organic material surface and a film formed on the substrate by plasma CVD method, said organic material surface having an unsaturated bond of carbon.

In usual instances of the plasma CVD method, it is known that adhesiveness can be improved by sputtering and cleaning a substrate surface with an inactive gas ion, which is generated by a plasma using such inert gas as argon, as a preliminary treatment before the film formation. This is intended to remove the materials which hinder the adhesion of the film to the substrate, for example, by physically blowing off a material of low vapor pressure or a water molecule and the like, which are adhered to a substrate surface and which are not easily removed therefrom even under reduced pressure. It is also known to improve an adhesiveness by reducing a previously oxidized surface with such plasma as hydrogen, so as to activate the surface. These are actions upon an adhered material or upon several molecular layers on a substrate surface to form a distinct boundary between the film and the substrate.

On the other hand, on the substrate surface, there exist concave and convex portions of about 0.1 $\mu$m or less in diameter and the film is formed selectively on the convex portions. Such contact between the film and the substrate at the boundary parts can be regarded as a contact point. Excepting the contacted points, there exist gaps of tens of Å to hundreds of Å. Thus, it is appreciated that an adhesive strength of the film is decided, by both the chemical bond strength such as Van der Waals force or the covalent bond force at the contacted points, and the total contacted area numbers at the convex portions. Therefore, it will be effective to increase both the chemical bond strength and the contacted areas between a film and a substrate, so as to strengthen the film adhesion.

The present invention is comprised of a material having an unsaturated bond of carbon as an organic material in a substrate which increases the chemical strength selected from the above specified two factors for the adhesion improvement.

In the case where $Si_xC_{1-x}$ ($0 \leq X \leq 1$) containing hydrogen or hydrogen and halogen, such as fluorine, is prepared by a plasma CVD method, the hydrogenated gas such as $SiH_4$, $Si_2H_6$, methane, and ethylene are used as a raw material gas. These gases are ionized or excited in plasma to produce anions or radical anions as hydrogen, which are diffused around an unsaturated bond ($\pi$-bond), such as a benzene ring, a double bond, and a triple bond. Then, electric charges of the $\pi$-bond are swayed by the anions or the radical anions, and the $\pi$-bond is activated to react with the radicals of film precursors existing around them, effecting a covalent bonding. That is, it can be said that the adhesion between a film and a material become strong by a material having unsaturated bonds ($\pi$-bond).

Also in the cases where the above covalent bonding are not effective, the hydrogen in C—H or Si—H effects a hydrogen bonding or a van der Waals bonding with polarized electrons in the substrate at the interface between the substrate and the film. At this time, it is preferable that an electron is not partialized but globalized, since globalization causes the electron cloud, the origin of Van der Waals bond, to sway and bond strongly. Namely, it can be said that the more globalized electron clouds present in a substrate, the stronger the adhesion attained.

As a result, it is effective to use a material having such an unsaturated bond ($\pi$-bond) as a benzene ring, a double bond and a triple bond in a substrate in order to obtain a transparent organic composite with an improved adhesiveness, having a surface of the compound defined as $SiC_{1-x}$ in which hydrogen is contained.

The present invention will be described below in further detail in the following Examples. The present invention is by no means limited to these Examples.

DETAILED DESCRIPTION OF THE PREFERRED EMBODIMENTS

In the Examples of the present invention, the differences are described in cases where a film having the compound defined as $Si_xC_{1-x}$, in which hydrogen or hydrogen and halogen, such as fluorine, are contained, is formed on each material. The materials used for the substrate were acrylic, polycarbonate, polyethylene, polypropylene, polystyrene, polyvinyl, polytetrafluoroethylene, polyethylene terephthalate and polymide. A conventional plasma CVD method using parallel plate electrodes was adopted to form the film. A substrate was placed by the side of a cathode in which electric power was supplied. A reaction vessel was evacuated to keep it in a high vacuum, then 15 sccm of methane gas, 3 sccm of silane gas and 50 sccm of hydrogen, as a raw atom of carbon, silicon, and hydrogen respectively, were introduced into the vessel through a mass-flow controller to control their amounts. The pressure in the vessel was kept at 0.05 Torr, and the reaction was carried out for 30 minutes. Plasma was generated by supplying the electrodes with 50 W of 13.56 MHz high frequency wave. At this time, an area of the cathode electrode was 78.5 cm$^2$ (Electric power density was 64 W/cm$^2$), and the electrode distance was 2 cm.

Any films formed on the substrate showed nearly equal features, which were 2200 kgf/mm$^2$ in Knoop-Hardness, ca. 90% in Transmittance at 500 nm, 2.5 g/cm$^3$ in Density, $5 \times 10^9$ dyn/cm$^2$ in Film-Stress, and 2500 Å in Film-Thickness.

Then, an adhesion test with the films formed on each substrate was conducted as follows. The test pieces were dipped in hot water kept at 50 deg. C for 10 days, and left at room temperature for 1 day. After that, a cellophane tape was applied to each film, and a peeling test was conducted to see whether or not the film could be peeled off from the substrate by pulling the tape. The test results were shown in the Table, in which PASS indicates a passing grade that the film was not peeled off.

As evident from the table, polycarbonate, polystyrene, polyethylene terephthalate, and polyamide, which have an unsaturated bond, showed a passing grade. On the other hand, among those having only a saturated bond, polyethylene is passing, but acrylic and polypropylene are not passing. Polyvinyl chloride and polytetrafluoroethylene having a halogen atom were passing, though they have only a saturated bond. It is considered that this is brought about by a stronger hydrogen bond made with the hydrogen of C—H and Si—H, as the halogen having higher electronegativity is contained in the substrate. For reference, chemical formulae of each material is shown in the table below.

As disclosed above, it is possible to obtain an abrasion resistant and reliable member, which has an excellent adhesiveness, by using a material having an unsaturated bond on a substrate to form an organic composite. The organic composite of the present invention is useful for components of an automobile and in architecture even if exposed to a severe environment, such as wind and rain. And also it can be applicable to a material which is lightweight and easy to be designed.

TABLE

| Substrates | Results |
| --- | --- |
| (1) acrylic | Not |
| (2) polycarbonate | PASS |
| (3) polyethylene | PASS |
| (4) polypropylene | Not |
| (5) polystyrene | PASS |
| (6) polyvinyl chloride | PASS |
| (7) polytetrafluoroethylene | PASS |
| (8) polyethylene terephthalate | PASS |
| (9) polyimide | PASS |

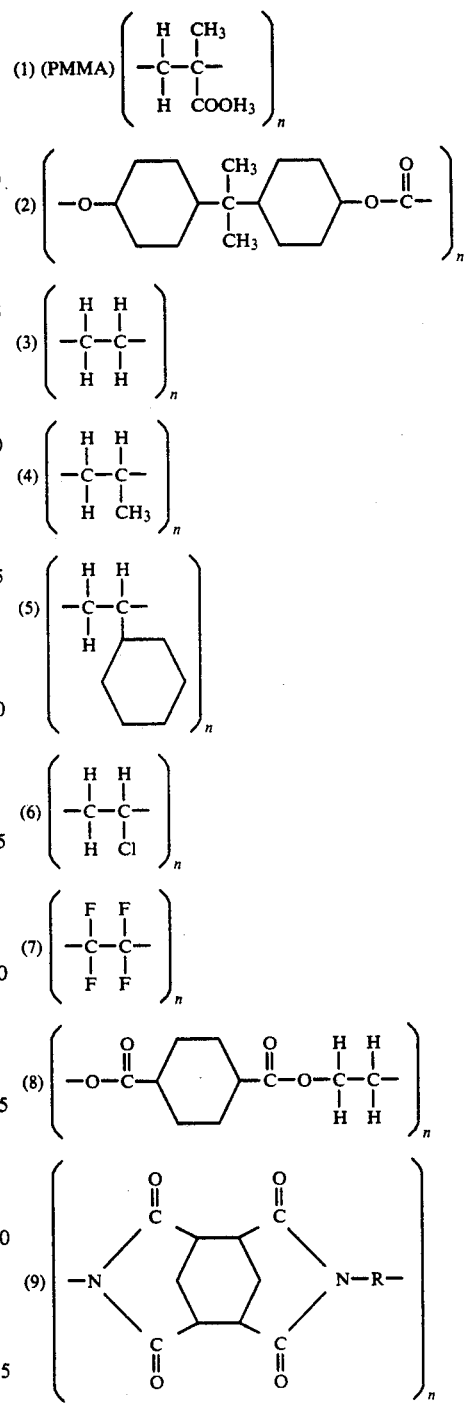

What is claimed is:

1. An organic composite which comprises a substrate having an organic material surface and a film formed on the substrate, said organic material surface having an unsaturated bond of carbon wherein the film is composed of a compound including Si, C and H where said Si and C are stoichiometrically present as $Si_xC_{1-x}$ and where $0 \leq x \leq 1$.

2. An organic composite according to claim 1, wherein the film is formed by plasma CVD method.

3. An organic composite according to claim 1, wherein the organic material is one of a plastic coating and a paint coating.

4. An organic composite comprising a film comprising $Si_xC_{1-x}$ ($0 \leq x \leq 1$) formed on a surface, said surface comprising a material selected from the group consisting of polycarbonate, polyethylene, polystyrene, polyvinyl chloride, polytetrafluoroethylene, polyethylene terephthalate and polyimide.

5. An organic composite which comprises a substrate having an organic material surface and a film formed on the substrate, said organic material surface having an unsaturated bond of carbon wherein the film is composed of a compound including Si, C, H and a halogen where said Si and C are stoichiometrically present as $Si_xC_{1-x}$ and where $0 \leq x \leq 1$.

6. An organic composite according to claim 5, wherein the halogen is fluorine.

* * * * *